United States Patent [19]

Wang

[11] Patent Number: 5,309,044
[45] Date of Patent: May 3, 1994

[54] MODIFIED WIDLAR SOURCE AND LOGIC CIRCUIT USING SAME

[75] Inventor: Karl L. Wang, Austin, Tex.

[73] Assignee: Motorola, Inc., Schaumburg, Ill.

[21] Appl. No.: 28,067

[22] Filed: Mar. 8, 1993

Related U.S. Application Data

[62] Division of Ser. No. 633,889, Dec. 26, 1990.

[51] Int. Cl.[5] .................. H03K 19/013; G05F 3/04
[52] U.S. Cl. ................... 307/454; 307/446; 323/312
[58] Field of Search ............ 307/454, 446, 570; 323/312, 315

[56] References Cited

U.S. PATENT DOCUMENTS

| | | | |
|---|---|---|---|
| 4,675,552 | 6/1987 | Wood | 307/454 |
| 5,038,053 | 8/1991 | Djenguerian | 323/315 |
| 5,144,164 | 9/1992 | Sugimoto | 307/454 |
| 5,160,857 | 11/1992 | Barre | 307/454 |
| 5,179,489 | 12/1992 | Mizuide | 323/312 |
| 5,237,214 | 8/1993 | Usami | 307/446 |

Primary Examiner—Edward P. Westin
Assistant Examiner—Andrew Sanders
Attorney, Agent, or Firm—Paul J. Polansky; James L. Clingan, Jr.

[57] ABSTRACT

A modified Widlar current source (74) includes a first transistor (84) having a collector providing a first terminal of the current source (74), a base, and an emitter connected through a first resistor (85) to a second terminal of the current source (74). A second transistor (82) has a collector connected to a power supply voltage terminal through a second resistor (81) and to the base of the first transistor (84), a base connected to the collector thereof, and an emitter connected to the second terminal of the current source (74) through a third resistor (83). A switching portion (80) selectively reduces a resistance between the power supply voltage terminal and the collector of the second transistor (82) in response to a control signal. Thus, current is selectively reduced, such as during a non-switching time of a logic circuit (70).

11 Claims, 7 Drawing Sheets

MODIFIED WIDLAR SOURCE AND LOGIC CIRCUIT USING SAME

This is a division of application Ser. No. 07/633,889 filed Dec. 26, 1990.

FIELD OF THE INVENTION

This invention relates generally to electrical circuits more particularly, to current sources and logic circuits using current sources.

BACKGROUND OF THE INVENTION

As time goes on, integrated circuit memories require faster access times to remain commercially competitive. Integrated circuit memory cores have traditionally included MOS memory cells located at intersections of word lines and bit line pairs, typically in each of a plurality of memory blocks. Recently, integrated circuit fabrication techniques have allowed bipolar transistors to be fabricated alongside MOS transistors. An improvement in speed became possible because bipolar transistors generally switch faster than MOS transistors. One way of using the bipolar transistors is in transistor-transistor logic (TTL) circuits. TTL circuits are faster than corresponding MOS circuits and can be modified to use MOS transistors as current sources. But TTL has disadvantages. Bipolar transistors used in TTL circuits require significant amounts of base current for biasing of transistor terminals, which restricts the usefulness of TTL circuits in a low power memory. TTL circuits also require a relatively large power supply voltage. In most applications, a power supply voltage of approximately 5.0 volts is provided, but in other applications the power supply voltage is reduced to about 3.0 volts or below. TTL circuits are unable to function correctly at such a small power supply voltage.

Another way of using bipolar transistors is in emitter coupled logic (ECL) circuits. ECL circuits are faster than TTL circuits. Furthermore, they can be used with relatively-small differential signals, which can be propagated more quickly throughout the integrated circuit. However ECL circuits require more current than corresponding MOS circuits. Integrated circuit memories must meet predetermined current specifications, and the large amount of current consumed by ECL circuits also restricts their usefulness. Another constraint is that if faster ECL circuits are used, for example in decoding, a large amount of current is switched internally during a short period of time. The large amount of current creates di/dt transients on internal ground lines. If too much current is switched at the same time, a spike in the ground voltage, from the ground line inductance (L) multiplied by di/dt, may cause internal circuitry to fail.

SUMMARY OF THE INVENTION

Accordingly, there is provided in one form, a current source having first, second, and third resistors, first and second transistors, and means coupled to a power supply voltage terminal and to a second terminal of the second resistor for selectively reducing a resistance between the power supply voltage terminal and the second terminal of the second resistor in response to a control signal. The first transistor has a collector for providing a first terminal of the current source, a base, and an emitter. The first resistor has a first terminal coupled to the emitter of the first transistor, and a second terminal providing a second terminal of the current source. The second resistor has a first terminal coupled to the power supply voltage terminal, and a second terminal coupled to the base of said first transistor. The second transistor has a collector coupled to the second terminal of the second resistor, a base coupled to the second terminal of the second resistor, and an emitter. The third resistor has a first terminal coupled to the emitter of the second transistor, and a second terminal coupled to the second terminal of the first resistor.

In another form there is provided a logic circuit for performing, a logical OR function between a plurality of input signals received at respective bases of a plurality of transistors, each of the plurality of transistors having collectors coupled to a first power supply voltage terminal, and having emitters coupled together and to the first terminal of the current source as described above, and providing an output signal therefrom, the second terminal of the current source coupled to a second power supply voltage terminal.

These and other objects, features and advantages will be more clearly understood from the following detailed description taken in conjunction with the accompanying drawings.

DETAILED DESCRIPTION OF THE INVENTION

Figure 1:
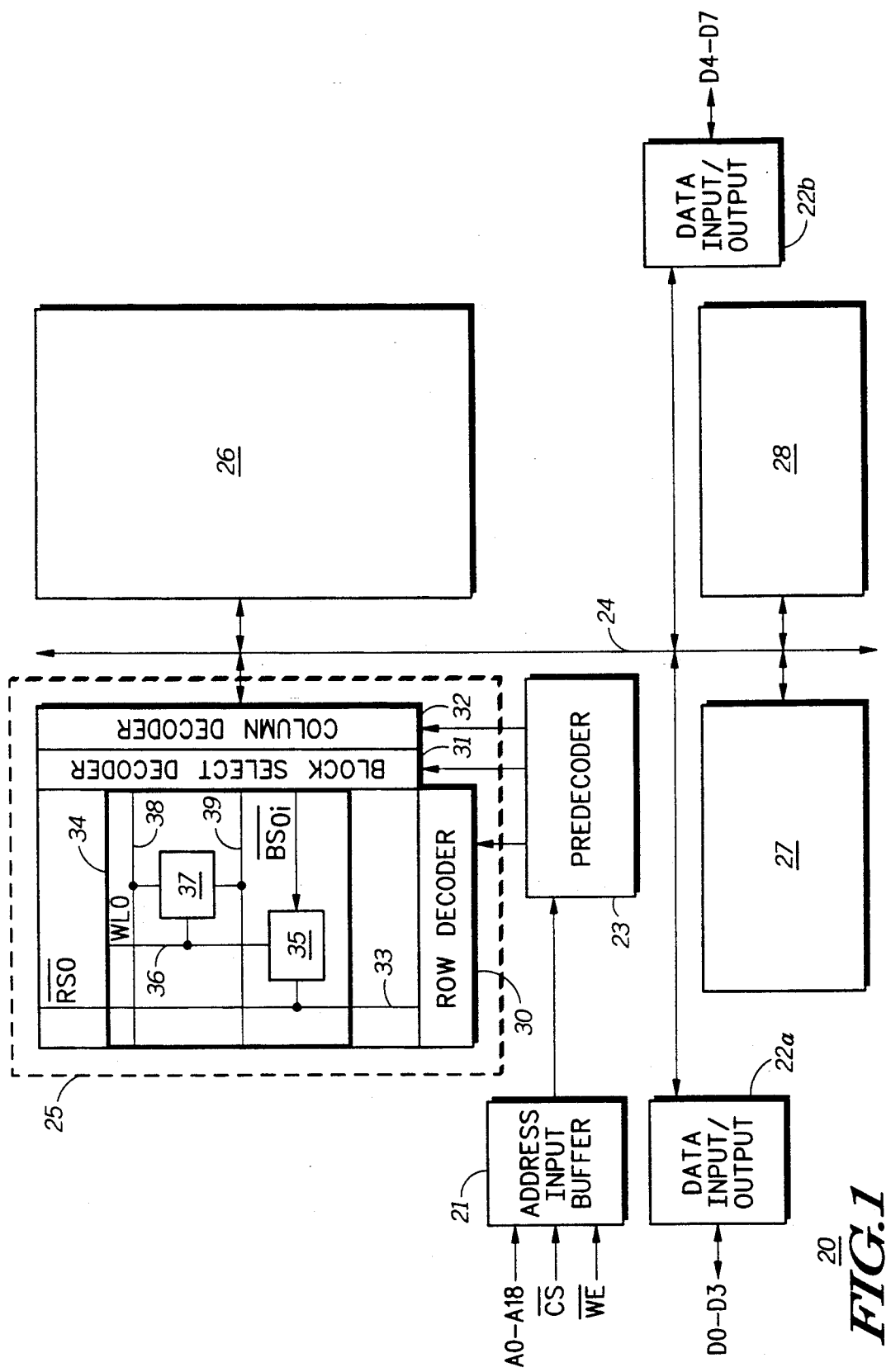
FIG. 1 illustrates in block form a memory, incorporating the present invention.

FIG. 1 illustrates in block form a memory 20 incorporating the present invention. Memory 20 includes generally an address input buffer 21, a data input/output circuit 22a, a data input/output circuit 22b, a predecoder 23, an internal bus 24, a first quadrant 25, a second quadrant 26, a third quadrant 27, and a fourth quadrant 28. Each quadrant is structurally similar and will be more particularly described with respect to quadrant 25. Quadrant 25 includes a row decoder 30, a block select decoder 31, a column decoder 32, a row select line 33, and 16 blocks, of which a representative memory block 34 is shown. Memory block 34 includes a plurality of word line drivers and a plurality of memory cells located at intersections of word lines and differential bit line pairs. A representative word line driver 35 coupled to row select line 33, and a representative memory cell 37 located at the intersection of a representative word line 36 and a representative pair of bit lines including bit line 38 and bit line 39, is illustrated in FIG. 1.

Address input buffer 21 receives nineteen address signals labelled "A0-A18", a chip select signal labelled "$\overline{CS}$", and a write enable signal labelled "$\overline{WE}$". Address input buffer 21 converts the input signals to ECL levels and couples them to predecoder 23. Predecoder 23 in turn provides a partial decoding of A0-A18, and provides a plurality of predecoded signals to row decoder 30, block select decoder 31, and column decoder 32 of quadrant 25. It should be apparent that the predecoded signals are similarly provided to each of the other three quadrants. In response to a first plurality of signals, row decoder 30 activates one row select line, such as row select line 33 conducting a signal labelled "RS0" thereon, and provides it to each memory block in quadrant 25. In response to a second plurality of signals, block select decoder 31 provides one of a plurality of block select signals to a corresponding plurality of word line driver circuits. When activated by a block select signal labelled "$BS_{0i}$", word line driver circuit 35 activates word line 36 providing a signal labelled "WL0" thereon.

During a read cycle, memory cells coupled to selected word line 36 couple their contents onto corresponding bit line pairs; for example, memory cell 37 provides its contents as a differential voltage between bit lines 38 and 39. In response to a third plurality of signals, column decoder 32 selects a predetermined number of bit line pairs, senses a corresponding differential voltage, and provides the differential voltage to a corresponding global data line pair which is part of internal bus 24. The differential voltages conducted on the global data line pairs of internal bus 24 are then converted to a single-ended voltage and provided externally as signals labelled "D0-D4" and "D5-D7" by data input/output circuits 22a and 22b, respectively.

During a write cycle, the flow of data is essentially reversed. Data input output circuits 22a and 22b receive as inputs signals D0-D3 and D4-D7, respectively, and provide them as differential voltages between corresponding write global data lines of a plurality of write global data line pairs included in internal bus 24. The memory cells are selected as in the read cycle, and if memory cell 37 is activated, a differential voltage on the corresponding write global data line pair is provided onto bit lines 33 and 39 to overwrite the value stored therein.

In the illustrated embodiment, memory 20 is organized as four quadrants, each quadrant including 16 blocks, each block having, 512 word lines and 128 bit line pairs. The data organization is by eight ($\times 8$). The dedication of the address signals and the decoding associated therewith is enumerated below in TABLE I.

TABLE I

| Signal Name | Address Decoded | Blocks Affected in FIG. 1 |
| --- | --- | --- |
| A0-A7 | Row address | Row decoder 30 |
| A8-A9 | Quadrant address | Quadrante 25 |
| A10-A13 | Block address | Block select decoder 31, local word line driver 35 |
| A14-A18 | Column address | Column decoder 32 |

It should be apparent, however, that different organizations are possible and that different address signals may be dedicated to different portions of the decoding. Note that additional signals besides those specifically described are present and are coupled between the various blocks illustrated in FIG. 1.

Figure 2:
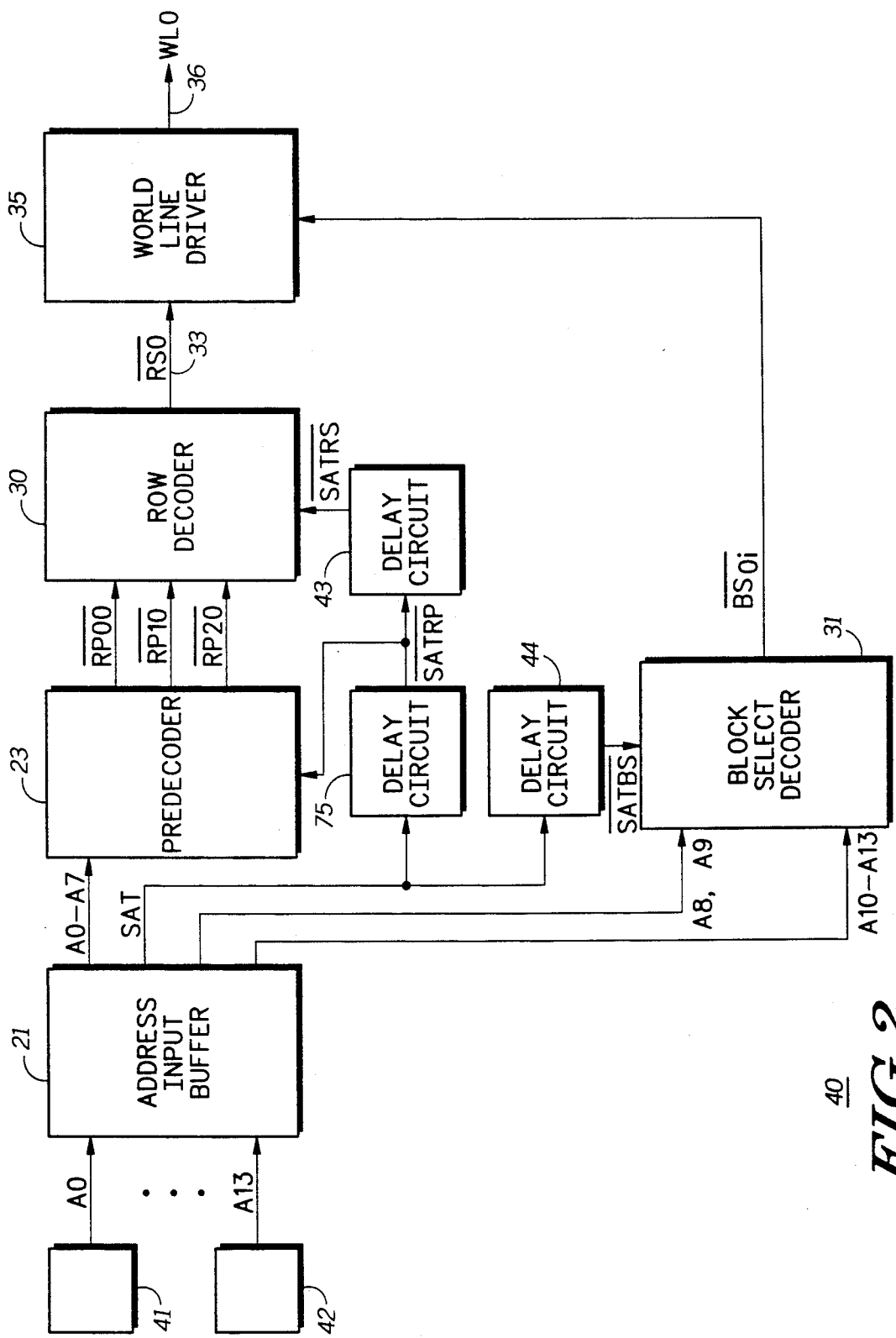
FIG. 2 illustrates in block form a decoding, circuit for the memory of FIG. 1.

FIG. 2 illustrates in block form a decoding circuit 40 for memory 20 of FIG. 1. Decoding circuit 20 represents the function of several blocks of FIG. 1, and reference numbers in common with FIG. 1 will be similarly designated in FIG. 2. Decoding circuit 40 includes a bonding pad 41, a bonding pad 42, address input buffer 21, predecoder 23, block select decoder 31, row decoder 30, word line driver 35, a delay circuit 75, a delay circuit 43, and a delay circuit 44. Each address input signal is received at ECL signal levels on a corresponding bonding pad. Illustrated in FIG. 2 are address signal A0 received on bonding pad 41, and address signal A13 received on bonding pad 42. Each bonding pad is coupled to address input buffer 21. Address input buffer 21 receives the plurality of address input signals and provides corresponding buffered signals at ECL signal levels. For ease of illustration, the buffered signal names are the same as corresponding address input signals.

In addition, address input buffer 21 provides an address transition detection signal labelled "SAT". Delay circuit 75 provides a signal labelled "$\overline{SATRP}$" having the same waveform as signal SAT a first predetermined time thereafter. Delay circuit 43 provides a signal labelled "$\overline{SATRS}$" having the same waveform as signal $\overline{SATRP}$ a second predetermined time thereafter. Delay circuit 44 provides a signal labelled "$\overline{SATBS}$" having the same waveform as signal $\overline{SATRS}$ a third predetermined time thereafter. The third predetermined time may be approximately equal to the second predetermined time so that signals $\overline{SATRS}$ and $\overline{SATBS}$ have approximately the same timing.

Predecoder 23 decodes signal group A0-A7 in response to signal $\overline{SATR}$. Predecoder 23 provides predecoded signals for three subgroups of address signal group A0-A7. Signals A0-A2 predecode signals labelled "RP00-RP07"; signals A3-A5 predecode signals labelled "RP10-RP17"; and, signals A6 and A7 predecode signals labelled "RP20-RP23". Signals RP00, RP10, and RP20 are illustrated in FIG. 2. Block select decoder 31 decodes signals A8 and A9, A10-A13 in response to signal $\overline{SATBS}$, to decode one of 16 blocks in a selected quadrant, represented by signal groups labelled "$BS_{0i}$-$BS_{15i}$", "$BS_{0j}$-$BS_{15j}$", "$BS_{0k}$-$BS_{15k}$", and "$BS_{0l}$-$BS_{15l}$". A representative block select signal $BS_{0i}$ is illustrated in FIG. 2. Row decoder 30 completely decodes the predecoded row select signals in response to $\overline{SATRS}$, and activates one row select line, such as illustrated row select line 33 providing signal RS0 thereon. Finally word line driver 35 is coupled to each of the plurality of row select lines, and in response to block select signal $BS_{0i}$, activates word line 36 represented as a signal "WL0".

The decoding in FIG. 2 may be altered in different embodiments. In a known BICMOS architecture, the buffered address signals are conducted at ECL signal levels. Other signals such as RP00, $BS_{0i}$, RS0, and WL0 are conducted at TTL signal levels. Signals are conducted faster using ECL signal levels because the separation in voltage between the logic high and the logic low voltage is much less than for TTL signal levels. However, if known ECL logic circuits are used by address input buffer 21, predecoder 23, block select decoder 31, and row decoder 30, the amount of current require would be excessive. Thus address buffers in known memories convert signal levels to TTL or MOS signal levels. The signal levels remain TTL or MOS throughout the remainder of the decoding process shown in FIG. 2. The extra time required for the development of the higher TTL or MOS signal levels slows the memory.

In memory 20, however, ECL logic circuits based on address transition detection reduce the current required by such an amount that ECL signal levels may be used at each decoding stage until word line driver 35 activates word line 36 by providing signal WL0 at a YM signal level, and the total current of memory 20 is still within specification. Thus, faster ECL circuitry may be used throughout much of the decoding. Memory 20 saves current by performing decoding in predecoder 23, row decoder 30, and block select decoder 31 sequentially, based on signals $\overline{SATRP}$, $\overline{SATRS}$, and $\overline{SATBS}$. Each decoder is based on a logic circuit using a modified Widlar current source, which reduces current except during switching as indicated by $\overline{SATRP}$, $\overline{SATRS}$, and $\overline{SATBS}$, and are each further described below. Note that address transition detection signal $\overline{SATBS}$ is further used to control sense amplifiers in data input/output circuits 22a and 22b, but is not specifically illustrated.

Figure 3:
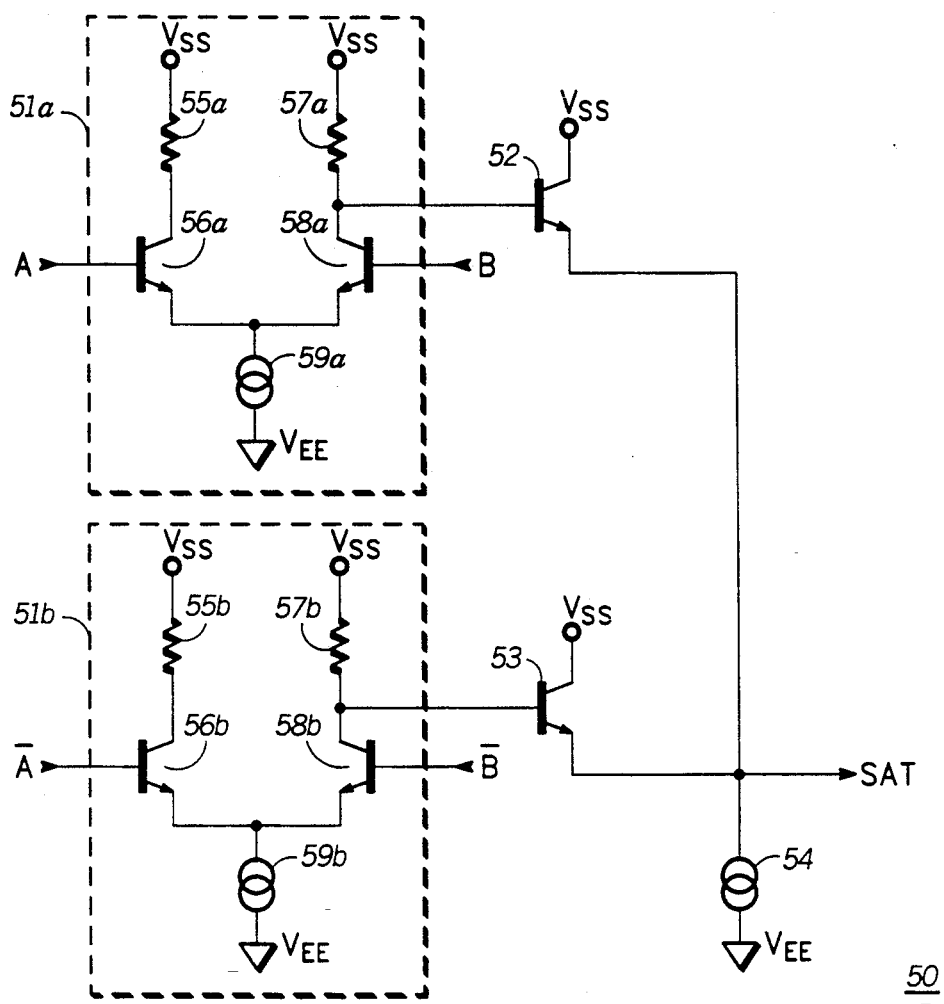
FIG. 3 illustrates in schematic form a circuit for providing an address transition detection signal.

FIG. 3 illustrates in schematic form a circuit 50 for providing an address transition detection signal. Circuit 50 comprises an input portion 51a, an input portion 51b, an NPN transistor 52, an NPN transistor 53, and a current source 54. Input portions 51a and 51b are identical except that they receive different input signals. Portion 51a comprises a resistor 55a, an NPN transistor 56a, a resistor 57a, an NPN transistor 58a, and a current source 59a. Portion 51b comprises a resistor 55b, an NPN transistor 56b, a resistor 57b, an NPN transistor 58b, and a current source 59b.

In input portion 51a, resistor 55a has a first terminal connected to a power supply voltage terminal labelled "$V_{SS}$", and a second terminal. $V_{SS}$ is a more-positive power supply voltage terminal, and is equal to 0 volts. Transistor 56a has a collector coupled to the second terminal of resistor 55a, a base for receiving an input signal labelled "A", and an emitter. Resistor 57a has a first terminal connected to $V_{SS}$, and a second terminal. Transistor 58a has a collector connected to the second terminal of resistor 57a, a base for receiving an input signal labelled "B", and an emitter connected to the emitter of transistor 56a. Current source 59a has a first terminal connected to the emitters of transistors 56a and 58a and a second terminal connected to a power supply voltage terminal labelled "$V_{EE}$". $V_{EE}$ is a more-negative power supply voltage terminal, and is equal to $-5.0$ volts. In BICOMS circuits, power supply voltage terminals are commonly designated either $V_{SS}$ and $V_{EE}$, or as $V_{DD}$ and $V_{SS}$. In the first designation, $V_{SS}$ being the more-positive power supply voltage terminal, and $V_{EE}$ the more-negative and corresponding to the standard ECL designation. The second designation corresponds to the standard MOS designation, with $V_{DD}$ being the more-positive power supply voltage terminal, and $V_{SS}$ being the more negative. It should be apparent that either convention may be used, as long as the difference in voltage between the more-positive and more-negative power supply voltage terminals is nominally 5.0 volts.

In input portion 51b, resistor 55b has a first terminal connected to $V_{SS}$, and a second terminal. Transistor 56b has a collector coupled to the second terminal of resistor 55b, a base for receiving an input signal labelled "$\overline{A}$", and an emitter. Resistor 57b has a first terminal connected to $V_{SS}$, and a second terminal. Transistor 58b has a collector connected to the second terminal of resistor 57b, a base for receiving an input signal labelled "$\overline{B}$", and an emitter connected to the emitter of transistor 56b. Current source 59b has a first terminal connected to the emitters of transistors 56b and 58b, and a second terminal connected to $V_{EE}$.

Transistor 52 has a collector connected to $V_{SS}$, a base connected to the collector of transistor 58a, and an emitter for providing an address transition signal labelled "SAT". Transistor 53 has a collector connected to $V_{SS}$, a base connected to the collector of transistor 58b, and an emitter connected to the emitter of transistor 52. Current source 14 has a first terminal connected to the emitters of transistors 52 and 53, and a second terminal connected to $V_{EE}$.

In operation, portion 51a receives signals A and B and provides an output in response to a difference in voltage between signals A and B. A positive difference in voltage between signals A and B results in a greater portion of the current conducted by current source 59a flowing through resistor 55a and transistor 56a, than is flowing through resistor 57a and transistor 58a. Thus, the voltage drop at the second terminal of resistor 57a is relatively less, and the voltage on the second terminal of resistor 57a increases. The values of the components can be chosen such that a small voltage difference between signals A and B results in a large voltage swing at the second terminal of resistor 57a. Portion 51b functions in the same manner, providing an output at the second terminal of resistor 57b in response to a difference in voltage between signals $\overline{A}$ and $\overline{B}$. Transistors 52 and 53 level shift their respective signal voltages, and the collectors of transistors 52 and 53 are wire-ORed to provide signal SAT. If $A > B$ or $\overline{A} > \overline{B}$, SAT is provided at a voltage of $(V_{SS} - V_{BE})$; Otherwise, SAT is provided at a voltage of approximately $(V_{SS} - V_{BE} - 1.5)$ volts.

Figure 3A:
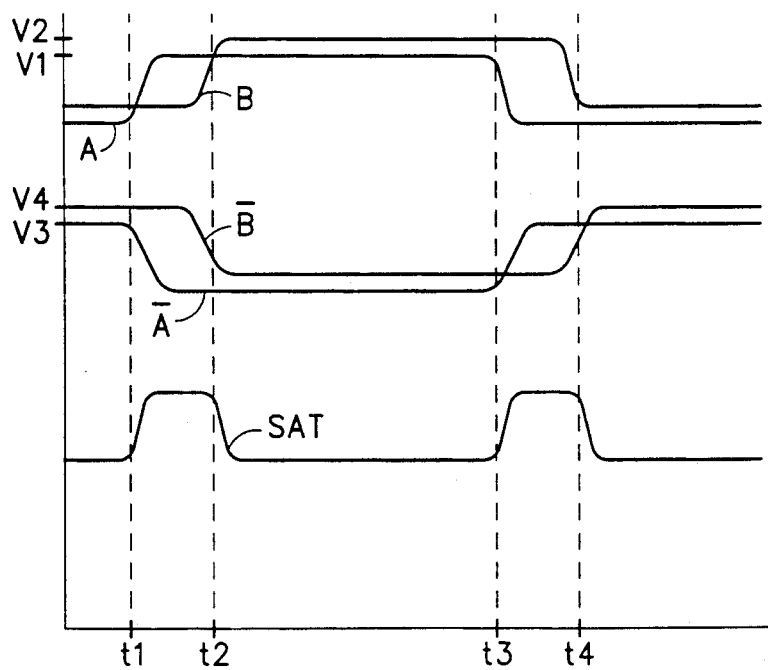
FIG. 3a illustrates a timing diagram of signals pertinent to FIG. 3.

The applicability of circuit 50 to memory 20 arises from the fact that signal B is equal to level-shifted and delayed signal A, and signal $\overline{B}$ is equal to level-shifted and delayed signal $\overline{A}$, where signal A is an address signal. As will become apparent below, it is desirable to provide address transition detection signal SAT as a pulse in response to address signal A changing either from a logic low to a logic high, or from a logic high to a logic low. Portion 51a provides SAT when address signal A changes from a logic low to a logic high; portion 51b provides SAT when address signal A changes from a logic high to a logic low. Portions corresponding to 51a and 51b are provided in memory 20 for all address signals (not shown in FIG. 3), and are wire-ORed together by connecting each node corresponding to the emitters of transistors 52 and 53. A single current source may be connected between all the emitters and $V_{EE}$. Signal SAT is thus active in response to any change in state of any one of address signals A0–A18. Referring to FIG. 3a, which illustrates a timing diagram of signals pertinent to FIG. 3, when A changes from a logic low to a logic high at a time labelled "t1", A momentarily exceeds B until a time labelled "t2", and the voltage at the second terminal of resistor 57a is approximately $V_{SS}$. Transistor 52 level shifts this volta-e to provide SAT at $(V_{SS} - V_{BE})$. At time t2, the logic high voltage of signal B is increased to a voltage labelled "v2", which is above the voltage of signal A, labelled "v1". Thus the voltage at the second terminal of resistor 57a again is becomes a logic low. When A changes 5, from a logic high to a logic low at a time labelled "t3", $\overline{A}$ momentarily exceeds $\overline{B}$ until a time labelled "t4", and the voltage at the second terminal of resistor 57b is approximately V$_{SS}$. Transistor 53 level shifts this voltage to provide SAT at (V$_{SS}$−V$_{BE}$). At time t4, the logic high voltage of signal B is increased to a voltage labelled "v4", which is above the voltage of signal A, labelled "v3". Thus the voltage at the second terminal of resistor 57b again becomes a logic low.

Figure 3B:
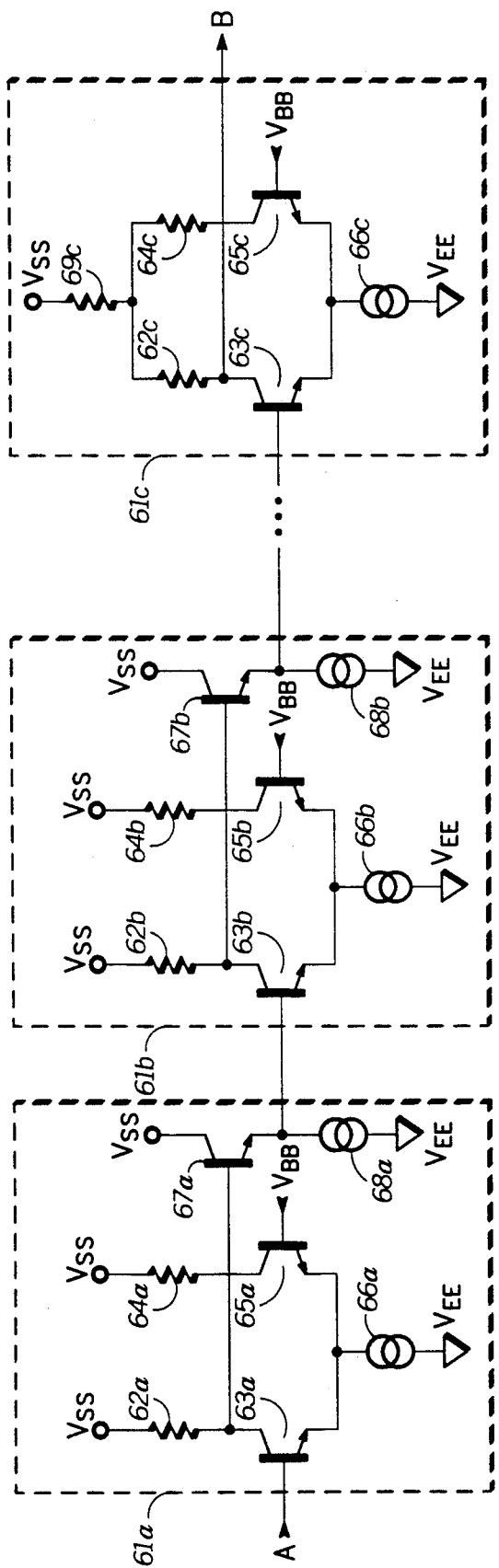
FIG. 3b illustrates in schematic form a delay circuit used in conjunction with the circuit of FIG. 3.

FIG. 3b illustrates in schematic form a level shift and delay circuit 60 used in conjunction with the circuit of FIG. 3. It should be apparent that other level shift and delay circuits may also be used. Circuit 60 comprises a plurality of portions, of which portions labelled 61a, 61b, and 61c. Detailed reference will be made to portion 61a only, because all other portions function similarly. Portion 61c functions slightly differently in a manner that will be described below. Corresponding elements between portions 61a, 61b, and 61c will be denoted with the same reference number except that elements including "a", "b", or "c" in their designation apply to corresponding portions 61a, 61b, and 61c. Portion 61a comprises a resistor 62a, an NPN transistor 63a, a resistor 64a, an NPN transistor 65a, a current source 66a, an NPN transistor 67a, and a current source 68a. Resistor 62a has a first terminal connected to V$_{SS}$, and a second terminal. Transistor 63a has a collector coupled to the second terminal of resistor 62a, a base for receiving address signal A, and an emitter. Resistor 64a has a first terminal connected to V$_{SS}$, and a second terminal. Transistor 65a has an emitter connected to the second terminal of resistor 65a, a base for receiving a reference voltage labelled "V$_{BB}$", and an emitter connected to the emitter of transistor 63a. Current source 66a has a first terminal connected to the emitters of transistors 63a and 65a, and a second terminal connected to V$_{EE}$. Transistor 67a has a collector connected to V$_{SS}$, a base connected to the second terminal of resistor 62a, and an emitter for providing an output signal of portion 61a. Current source 68a has a first terminal connected to the emitter of transistor 67a, and a second terminal connected to V$_{EE}$. The output signal of portion 61a provides the input signal at the base of transistor 63b for succeeding portion 61b.

Portion 61c is different than the other portions such as portion 61a and 61b because it does not have elements corresponding to transistor 67a and current source 68a. It is necessary for signal B to be provided at a higher voltage level than signal A. However, resistor 69c, which has a first terminal connected to V$_{SS}$, and a second terminal connected to the first terminals of resistors 62c and 64c, is included to provide a smaller voltage drop.

Each portion is operated as an inverting differential amplifier. Reference voltage V$_{BB}$ is chosen to be midway between the anticipated voltage swing of signal A; thus if signal A is at a logic high, transistor 63a becomes relatively more conductive than transistor 65a, and steers a greater portion of the current conducted by current source 66a therethrough. Thus the IR drop across resistor 62a increases, and the output of portion 61a, provided on the emitter of transistor 67a, decreases. The sizes of the elements in portion 61a are chosen to provide a unity gain, so that voltage swings in succeeding stages are preserved. It should be noted that since each portion 61a, 61b, and 61c are inverting, an even number of portions is necessary, although only three are shown in FIG. 3b. Signal B is ultimately provided at the output terminal of the last portion, shown in FIG. 3b as 61c. The output terminal of portion 61c is not level-shifted downward by V$_{BE}$, as in portions 61a and 61b, to make allow signal B to have a higher voltage level. However, resistor 69c is included to provide a voltage drop equal to the current conducted by current source 66c times the resistance of resistor 69c.

Figure 4:
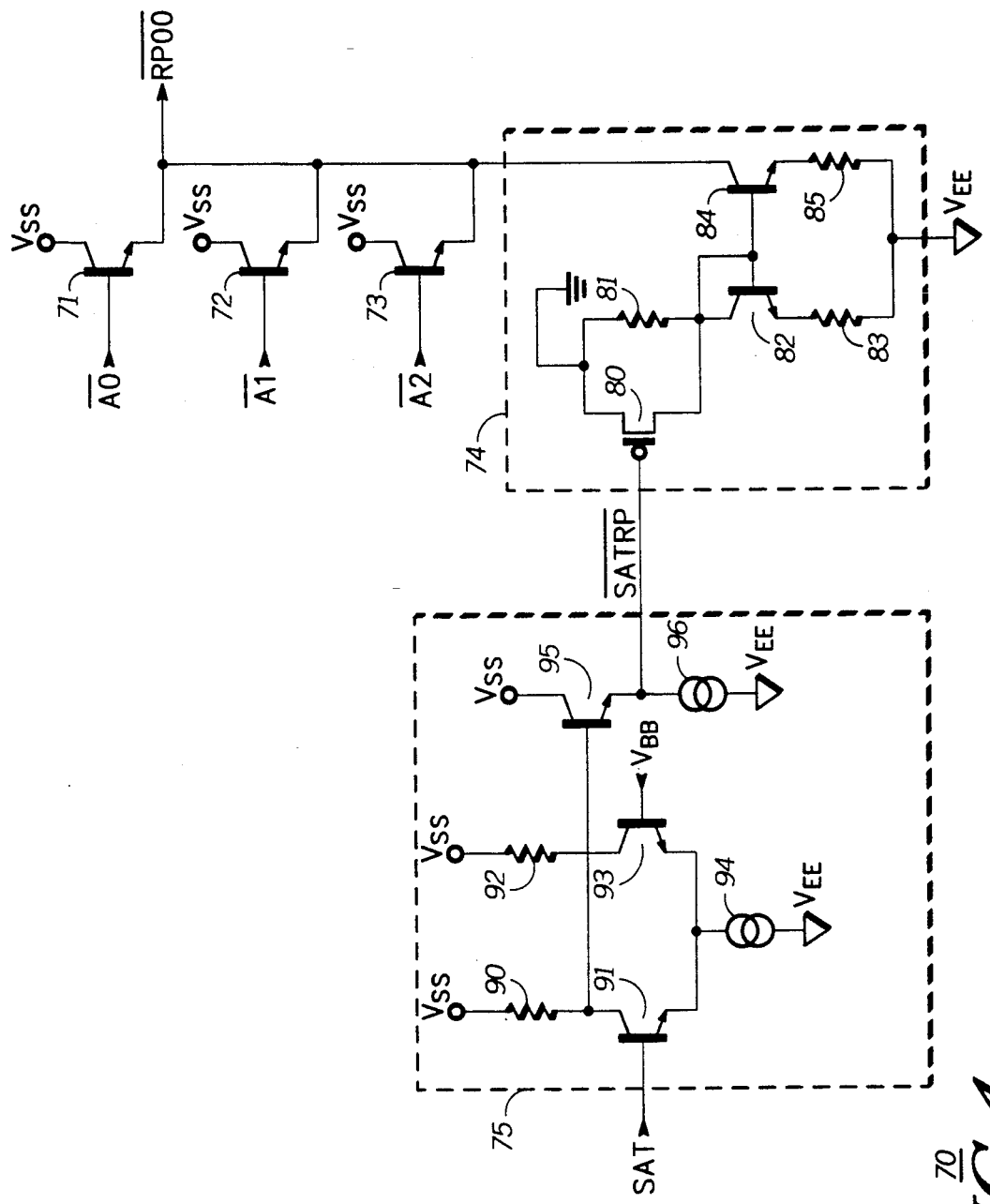
FIG. 4 illustrates in schematic form a row predecoder circuit in accordance with the present invention.

FIG. 4 illustrates in schematic form a row predecoder circuit 70 in accordance with the present invention. Row predecoder circuit 70 comprises NPN transistors 71, 72, and 73, a current source 74, and a delay circuit 75. Current source 74 includes a P-channel transistor 80, a resistor 81, an NPN transistor 82, a resistor 83, an NPN transistor 84, and a resistor 85. Delay circuit 75 includes a resistor 90, a transistor 91, a resistor 92, a transistor 93, a current source 94, a transistor 95, and a current source 96. Transistors 71-73 each have a collector connected to V$_{SS}$, a base for receiving a respective one of address signals $\overline{A0}$, $\overline{A1}$, and $\overline{A2}$, and collectors connected together and providing predecoded row address signal $\overline{RP00}$. In current source 74, transistor 80 has a source connected to V$_{SS}$, a gate for receiving a signal labelled "SATRP", and a drain. Resistor 81 has a first terminal connected to V$_{SS}$, and a second terminal connected to the drain of transistor 80. Transistor 82 has a collector connected to the drain of transistor 80 and to the second terminal of resistor 81, a base connected to the drain of transistor 80 and to the second terminal of resistor 81, and an emitter. Resistor 83 has a first terminal connected to the emitter of transistor 82, and a second terminal connected to V$_{EE}$. Transistor 84 has a collector providing a first terminal of current source 74, a base connected to the base of transistor 82, and an emitter. Resistor 85 has a first terminal connected to the emitter of transistor 84, and a second terminal connected to V$_{EE}$. In delay circuit 75, resistor 90 has a first terminal connected to V$_{SS}$, and a second terminal. Transistor 91 has a collector connected to the second terminal of resistor 90, a base for receiving signal SAT, and an emitter. Resistor 92 has a first terminal connected to V$_{SS}$, and a second terminal. Transistor 93 has a collector connected to the second terminal of resistor 92, a base for receiving reference voltage V$_{BB}$, and an emitter connected to the emitter of transistor 91. Current source 94 has a first terminal connected to the emitters of transistors 91 and 93, and a second terminal connected to V$_{EE}$. Transistor 95 has a collector connected to V$_{SS}$, a base connected to the second terminal of resistor 90, and a collector for providing signal $\overline{SATRP}$. Current source 96 has a first terminal connected to the collector of transistor 95, and a second terminal connected to V$_{EE}$.

Row predecoder circuit 70 performs a logical OR function between address signals $\overline{A0}$, $\overline{A1}$, and $\overline{A2}$. Transistor 71, 72, and 73 each receive a respective one of the address signals. If any one of the address signals is a logic high, then $\overline{RP00}$ is provided at the voltage of the logic high address signal minus one V$_{BE}$. However, if each of the three address signals is a logic low, then $\overline{RP00}$ is provided at a logic low. Alternatively, $\overline{RP00}$ is provided at a logic low if each address signal of the group A0, A1, and A2 is a logic high. By alternately using true and complement address signals for each input, each predecoded signal of the group $\overline{RP00}$-$\overline{RP07}$ may be formed.

Delay circuit 75 provides signal $\overline{SATRP}$ a predetermined time after signal SAT becomes active. Signal SAT is formed by a wire-OR of the address transition detection signal of each individual address, as previously illustrated and described in FIG. 3. Delay circuit 75 provides a voltage at the second terminal of resistor

90 in response to signal SAT being greater than VBBTransistor and current source 96 then serve to level-shift the voltage at the second terminal of resistor 90 by one $V_{BE}$. Thus, signal $\overline{SATRP}$ has a logic high voltage of $(V_{SS}-V_{BE})$, and a logic low voltage of $(V_{SS}-V_{BE}-1.5)$. It should be apparent that more difference amplifiers like that formed by resistors 90 and 92, transistors 91 and 93, and current source 94 could be used to increase the predetermined delay between SAT and $\overline{SATRP}$.

The use of current source 74 reduces the current required to provide signal $\overline{RP00}$ at a logic low by conducting a large amount of current during switching only, as indicated by signal $\overline{SATRP}$ being a logic low. When not switching, indicated by signal $\overline{SATRP}$ being a logic high, the amount of current is reduced to a standby current. This reduction in current is important because it allows circuit 70 to be an ECL logic circuit, which is faster than a TTL or MOS circuit, while keeping the overall current of memory 20 within a predefined specification. Current source 74 is a modified Widlar current source. Widlar current sources are well known in the art. See Gray and Meyer, *Analysis and Design of Integrated Circuits*, p. 202. In a Widlar current source, resistors 81, 83, and 85 and transistors 82 and 84 are present and are connected as otherwise illustrated in FIG. 4. Let $R_{81}$ be the resistance of resistor 81, $R_{83}$ be the resistance of resistor 83, $R_{85}$ be the resistance of resistor 85, $I_{81}$ be a current flowing through resistor 81, $I_{83}$ be a current flowing through resistor 83, and $I_{85}$ be a current flowing through resistor 85. Since base currents are relatively small in relation to collector currents, it can be assumed that $I_{81}=I_{83}$, and that the current flowing into the collector of transistor 84 is equal to $I_{85}$. The current provided by the current source is given by:

$$I_{85}=I_{81}(R_{85}/R_{83}) \quad [1]$$

The current 181 is given by:

$$I_{81}=(V_{SS}-V_{EE}-V_{BE})/(R_{81}+R_{83}) \quad [2]$$

where $V_{BE}$ is the base-to-emitter diode voltage drop of transistor 82, typically about 0.8 volts.

If circuit 70 were to use a typical Widlar current source, the amount of current required would be excessive for use in high density, high-speed memories. However circuit 70 decreases total current requirements through modified Widlar current source 74. Transistor 80 is coupled in parallel with resistor 81. The threshold voltage of transistor 80, $V_{TH}$, is chosen to be greater than $V_{BE}$, at approximately 1.0 volts. Thus when $\overline{SATRP}$ is a logic high at $(V_{SS}-V_{BE})$, transistor 94 is nonconductive; however when $\overline{SATRP}$ is active at a logic low of $(V_{DD}-V_{BE}-1.5)$, transistor 80 is conductive and has a characteristic on resistance labelled $R_{80}$. $R_{80}$ is much less than $R_{81}$, and the resistance of the parallel combination of transistor 80 and resistor 81 can be approximated as $R_{80}$. Thus, when $\overline{SATRP}$ is active, $I_{81}$ is much greater and is approximately determined by:

$$I_{81}=(V_{SS}-V_{EE}-V_{BE})/(R_{80}+R_{83}) \quad [3$$

and thus $I_{81}$ is proportionately greater, where $I_{85}$ is as calculated in equation [1]. The advantage of modified Widlar current source 74 is that current is drawn only when decoding is to occur as determined by address transition signal $\overline{SATRP}$. Thus, the total amount of current is reduced, and ECL signal levels and decoding circuitry may be used for additional decoding while maintaining current within a predetermined specification. The use of ECL signal levels and circuitry in turn decreases decoding time. It should be noted that if several modified Widlar current sources activated by the same control signal are desired, that portion including transistors 80 and 82 and resistors 81 and 83 may be shared, with the second terminal of resistor 81 being connected to bases of other transistors. The number of current sources capable of being formed is limited only to the extent that the amount of base current provided becomes significant.

Figure 5:
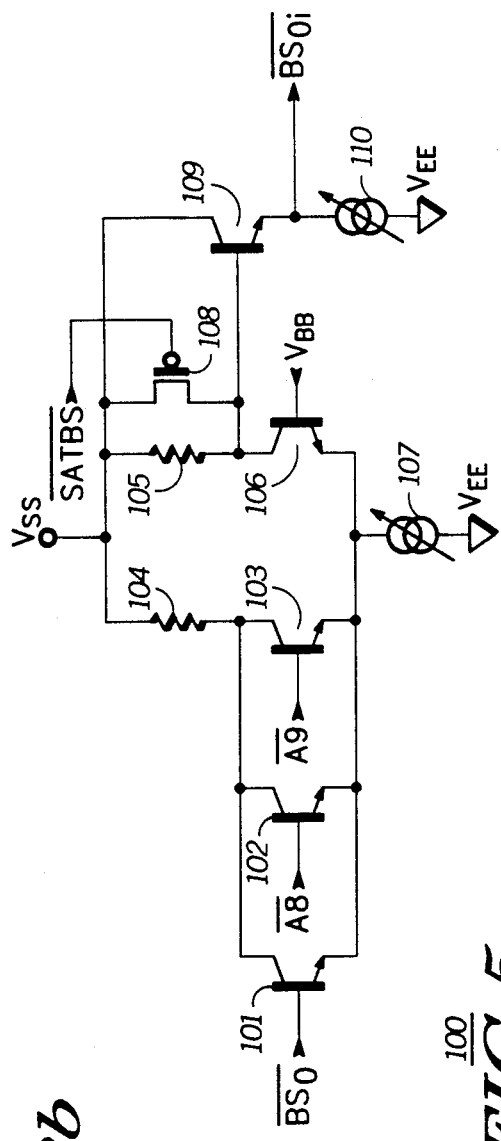
FIG. 5 illustrates in schematic form a block select decoder circuit in accordance with the present invention.

FIG. 5 illustrates in schematic form a block select decoder circuit 100 in accordance with the present invention. Block select decoder includes NPN transistors 101, 102, and 103, resistors 104 and 105, an NPN transistor 106, a modified Widlar current source 107, a P-channel transistor 108, an NPN transistor 109, and a modified Widlar current source 110. Transistor 101 has a collector, a base for receiving block select signal $\overline{BSO}$, and an emitter. Transistor 102 has a collector coupled to the collector of transistor 101, a base for receiving address signal $\overline{A8}$, and an emitter connected to the emitter of transistor 101. Transistor 103 has a collector coupled to the co-llectors of transistors 101 and 102, a base for receiving address signal $\overline{A9}$, and an emitter connected to the emitters of transistor 101 and 102. Resistor 104 has a first terminal connected to $V_{SS}$, and a second terminal connected to the collectors of transistors 101-103. Resistor 105 has a first terminal connected to $V_{SS}$, and a second terminal. Transistor 106 has a first terminal connected to the second terminal of resistor 105, a base for receiving reference voltage $V_{BB}$, and an emitter connected to the emitters of transistors 101-103. Current source 107 has a first terminal connected to the emitters of transistors 101-103 and 106, and a second terminal connected to $V_{EE}$. Current source is a modified Widlar current source controlled by a signal labelled "$\overline{SATBS}$" and operates as shown for current source 74 in FIG. 4. Transistor 108 has a source connected to $V_{SS}$, a drain for receiving signal $\overline{SATBS}$, and a drain connected to the second terminal of resistor 105. Transistor 109 has a collector connected to $V_{SS}$, a base connected to the second terminal of resistor 105, and an emitter for providing block select signal labelled "$\overline{BS_j}$". Current source 110 has a first terminal connected to the emitter of transistor 110, and a second terminal connected to $V_{EE}$. Current source 110 is a modified Widlar current source controller by signal $\overline{SATBS}$, and operates as shown by current source 74 in FIG. 4.

Block decoder circuit 100 is another implementation of an OR gate. Circuit 100 performs a logical OR operation between signals $\overline{BSO}$, $\overline{A8}$, and $\overline{A9}$. Thus if any of signals $\overline{BS0}$, $\overline{A8}$, or $\overline{A9}$ is a logic high, the voltage at the second terminal of resistor 105 is at $V_{SS}$ and output signal $BS_{0i}$ is provided at a logic high Of $(V_{SS}-VBE)$. If each of signals $\overline{BS0}$, $\overline{A8}$, and $\overline{A9}$ is active at a logic low, then the current provided by current source 107 is steered through transistor 106. When $\overline{SATBS}$ is negated as a logic high, and current source 107 provides the relatively-small (standby) current, the logic low at the base of transistor 109, and hence the logic low of signal $\overline{BS_i}$ is thus determined by the value of resistor 105. The value of resistor 105 is chosen to set the logic low voltage of $\overline{BS_{0i}}$ to $(V_{SS}-V_{BE}-1.5)$. When $\overline{SATBS}$ is asserted as a logic low and current source 107 provides the relatively-large current, transistor 108 becomes conductive to decrease the resistance from the base of transistor 109 to $V_{SS}$ to make the IR drop approximately equal.

Figure 6:
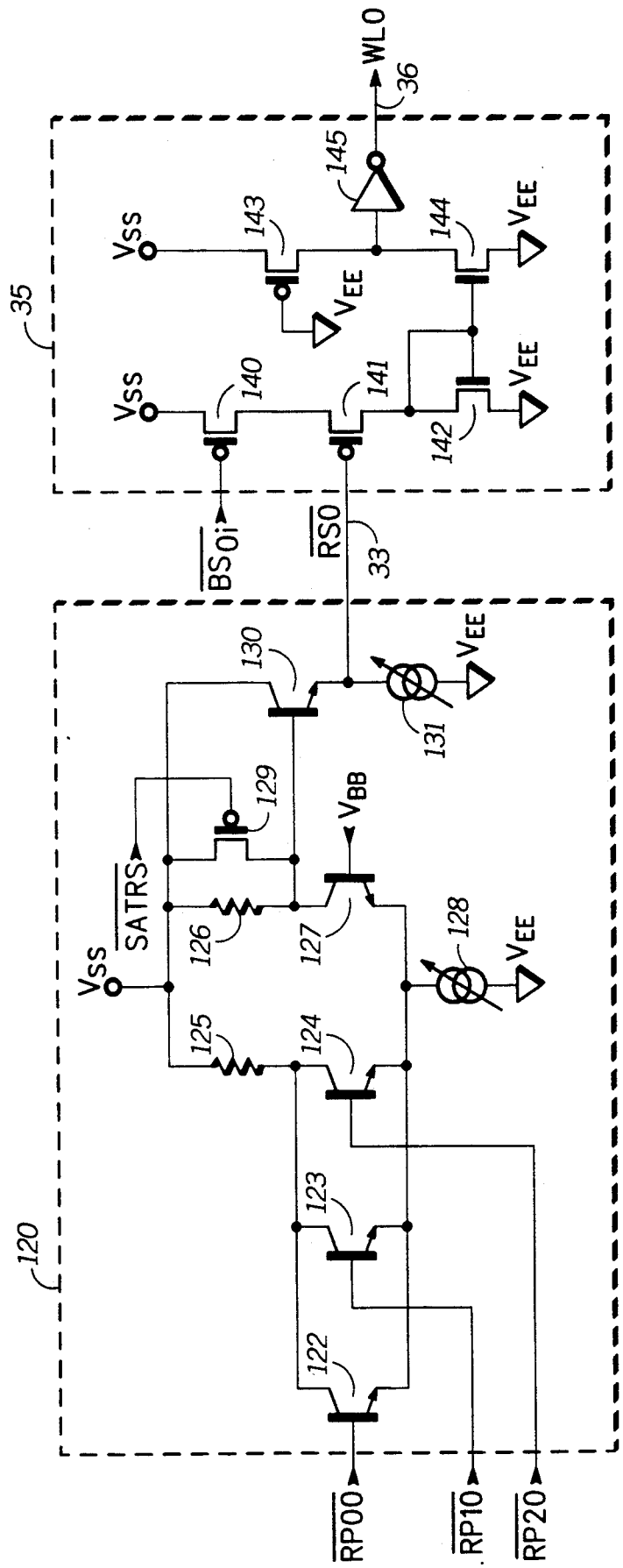
FIG. 6 illustrates in schematic form a portion of the circuit of FIG. 2 in accordance with the present invention.

FIG. 6 illustrates in schematic form a portion 120 of row decoder circuit 30 and word line driver circuit 35 of FIG. 1, in accordance with the present invention. Portion 120 is coupled to word line driver 35 by row select line 33. Portion 120 comprises NPN transistors 122-124, resistors 125 and 126, an NPN transistor 127, a current source 128, a P-channel transistor 129, an NPN transistor 130, and a current source 131. Word line driver circuit 35 comprises P-channel transistors 140 and 141, an N-channel transistor 142, a P-channel transistor 143, an N-channel transistor 144, and an inverter 145. In portion 120, transistor 122 has a collector, a base for receiving predecoded row signal RP00, and an emitter. Transistor 123 has a collector coupled to the collector of transistor 122, a base for receiving predecoded row signal RP10, and an emitter connected to the emitter of transistor 122. Transistor 124 has a collector coupled to the collectors of transistors 122 and 123, a base for receiving predecoded row signal RP20, and an emitter connected to the emitters of transistor I?? and 123. Resistor 125 has a first terminal connected to $V_{SS}$, and a second terminal connected to the collectors of transistors 122-124. Resistor 126 has a first terminal connected to $V_{SS}$, and a second terminal. Transistor 127 has a first terminal connected to the second terminal of resistor 126, a base for receiving reference voltage $V_{BB}$, and an emitter connected to the emitters of transistors 122-124. Current source 128 has a first terminal connected to the emitters of transistors 122-124 and 127, and a second terminal connected to $V_{EE}$. Current source is a modified Widlar current source controlled by a signal labelled "$\overline{SATRP}$" and operates as shown for current source 74 in FIG. 4. Transistor 129 has a source connected to $V_{SS}$, a drain for receiving signal $\overline{SATRP}$, and a drain connected to the second terminal of resistor 126. Transistor 130 has a collector connected to $V_{SS}$, a base connected to the second terminal of resistor 126, and an emitter for providing row select signal $\overline{RS0}$ to row select line 33. Current source 131 has a first terminal connected to the emitter of transistor 130, and a second terminal connected to $V_{EE}$. Current source 130 is a modified Widlar current source controller by signal $\overline{SATRP}$, and operates as shown by current source 74 in FIG. 4.

In word line driver 35, transistor 140 has a source connected to $V_{SS}$, a gate for receiving block select signal $\overline{BS_{0i}}$, and a drain. Transistor 141 has a source connected to the drain of transistor 140, a gate connected to row select line 33 and receiving row select signal $\overline{RS0}$ thereon, and a drain. Transistor 142 has a drain connected to the drain of transistor 141, a gate connected to the drain of transistor 141, and a source connected to $V_{EE}$. Transistor 143 has a source connected to $V_{SS}$, a gate connected to $V_{EE}$, and a drain. Transistor 144 has a drain connected to the drain of transistor 143, a gate connected to the drain of transistor 141, and a source connected to $V_{SS}$. Inverter 145 has an input terminal connected to the drain of transistor 143, and an output terminal connected to word line 36 and providing word line signal WL0 thereon.

Portion 120 is structurally identical to circuit 100 of FIG. 5 except that it receives different input signals. Portion 120 provides signal RSO in response to a logical OR of signals $\overline{RP00}$, $\overline{RP10}$, and $\overline{RP20}$. Current sources 128 and 133 are modified Widlar current sources as illustrated by current source 74 of FIG. 4, and are controlled by signal $\overline{SATRP}$. In addition, transistor 129 receives signal $\overline{SATRP}$. Thus, row select signal $\overline{RS0}$ is provided to row select line 33 at ECL levels by a circuit which draws a substantial amount of current only during switching as indicated by signal $\overline{SATRS}$.

Word line driver 35 is coupled to row select line 33. If both $\overline{BS_{0i}}$ and $\overline{RS0}$ are active at a logic low, then transistors 140 and 141 are both conductive, and a large current flowing through transistor 142 is mirrored to flow through transistor 144. Thus the input terminal of inverter 143 is at a logic low, and provides WL0 at a logic high. If either $\overline{BS_{0i}}$ or $\overline{RS0}$ is inactive at a logic high, then substantially no current flows through transistor 142, and transistor 144 is biased similarly to be nonconductive. Transistor 143 provides charging current to quickly pull up the input terminal of inverter 145, and WL0 is provided quickly at a logic low. Note that word line driver 35 receives ECL signal levels and provides WL0 at relatively-high CMOS signal levels, which are necessary to select CMOS memory cells such as memory cell 37 shown in FIG. 1.

Figure 7:
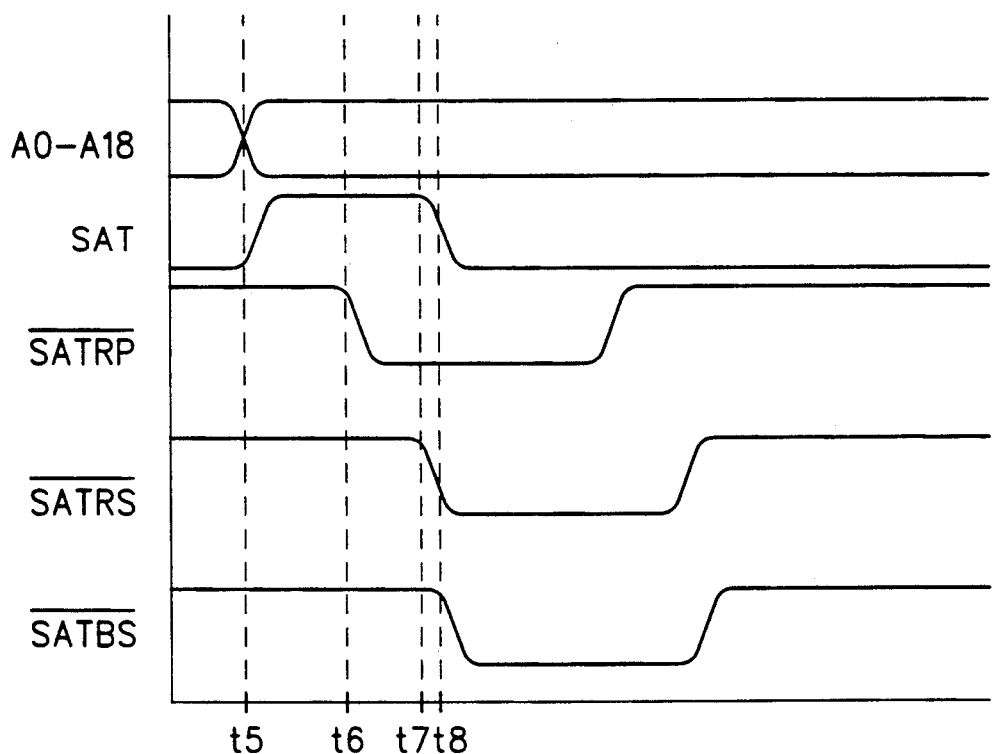
FIG. 7 illustrates in a timing diagram of the address transition detection signals pertinent to the circuits of FIGS. 3-5.

FIG. 7 illustrates a timing diagram of the address transition detection signals pertinent to the circuits of FIGS. 3-5. After a transition in any one of address signals A0-A18 at a time labelled "t5", address transition detection signal SAT becomes active. A first predetermined time later, signal $\overline{SATRP}$ is provided at a time labelled "t6", as described in FIG. 4. A second predetermined time later at a time labelled "t7", signal SATRS becomes active. Finally, a third predetermined time later, at a time labelled "t8", signal $\overline{SATBS}$ becomes active. As shown in FIG. 7, the third predetermined time is approximately equal to the second predetermined time.

It should be apparent by now that a low power BICMOS memory using address transition detection as illustrated in FIG. 1 has been described. The memory performs address transition detection on each of a plurality of address signals. As described in FIG. 3, a first ECL difference amplifier detects a low-tohigh transition with a first input being the address signal, and a second input being the address signal delayed and level-shifted, and a second ECL difference amplifier uses a complement of the first and second inputs to detect a high-tolow transition. The outputs of two corresponding ECL difference amplifiers for each address signal are wire-ORed together to form the address transition detection signal. The address transition detection signal is delayed for first, second, and third predetermined times, as illustrated in FIG. 7, to sequentially perform row predecoding, row decoding, and block decoding, respectively, as illustrated in FIGS. 2, 4, 5, and 6. The decoding is performed by logic circuits using modified Widlar current sources, illustrated in FIG. 4, which decrease the current required except during decoding, as indicated by a corresponding address transition detection signal. The saving in current allows faster ECL circuits to be used and decreases peak current on the internal power supply lines.

While the invention has been described in the context of a preferred embodiment, it will be apparent to those skilled in the art that the present invention may be modified in numerous ways and may assume many embodiments other than that specifically set out and described above. For example, the use of the address signals for block, row, and column decoding and the size and data organization of the memory may be varied. Address input signals could be received in TTL levels instead of ECL levels in another embodiment. The modified Widlar current source may also be used in non-memory applications. Accordingly, it is intended by the appended claims to cover all modifications of the invention which fall within the true spirit and scope of the invention.

I claim:

1. A current source comprising:
   a first transistor having a collector for providing a first terminal of the current source, a base, and an emitter;
   a first resistor having a first terminal coupled to said emitter of said first transistor, and a second terminal providing a second terminal of the current source;
   a second resistor having a first terminal coupled to a power supply voltage terminal, and a second terminal coupled to said base of said first transistor;
   a second transistor having a collector coupled to said second terminal of said second resistor, a base coupled to said second terminal of said second resistor, and an emitter;
   a third resistor having a first terminal coupled to said emitter of said second transistor, and a second terminal coupled to said second terminal of said first resistor; and
   means coupled to said power supply voltage terminal and to said second terminal of said second resistor, for selectively reducing a resistance between said power supply voltage terminal and said second terminal of said resistor in response to a control signal.

2. The current source of claim 1 wherein said means comprises a third transistor having a first current electrode coupled to said power supply voltage terminal, a control electrode for receiving said control signal, and a second current electrode coupled to said second terminal of said second resistor.

3. The current source of claim 2 wherein said third transistor is a P-channel MOS transistor.

4. A logic circuit for performing a logical OR function between a plurality of input signals received at respective bases of a plurality of transistors, each of the plurality of transistors having collectors coupled to a first power supply voltage terminal, and having emitters coupled together and to a current source and providing an output signal therefrom, the current source comprising:
   a first transistor having a collector coupled to the emitter of said plurality of transistors and providing a first terminal of the current source, a base, and an emitter;
   a first resistor having a first terminal coupled to said emitter of said first transistor, and a second terminal coupled to a second power supply voltage terminal;
   a second resistor having a first terminal coupled to the first power supply voltage terminal, and a second terminal coupled to said base of said first transistor;
   a second transistor having a collector coupled to said second terminal of said second resistor, a base coupled to said second terminal of said second resistor, and an emitter;
   a third resistor having a first terminal coupled to said emitter of said second transistor, and a second terminal coupled to said second terminal of said first resistor; and
   means coupled to said first power supply voltage terminal and to said second terminal of said second resistor, for selectively reducing a resistance between the first power supply voltage terminal and said second terminal of said resistor in response to a control signal.

5. The logic circuit of claim 4 wherein the control signal is provided in response to a transition of at least one of said plurality of input signals.

6. The logic circuit of claim 4 wherein said means comprises a third transistor having a first current electrode coupled to the first power supply voltage terminal, a control electrode for receiving said control signal, and a second current electrode coupled to said second terminal of said second resistor.

7. The logic circuit of claim 6 wherein said third resistor is a P-channel MOS transistor.

8. A logic circuit comprising:
   switching means for selectively coupling an output terminal to a predetermined logic potential in response to a predetermined logic function between a plurality of input signals;
   a first transistor having a collector coupled to said output terminal, a base, and an emitter;
   a first resistor having a first terminal coupled to said emitter of said first transistor, and a second terminal coupled to a first power supply voltage terminal;
   a second resistor having a first terminal coupled to a second power supply voltage terminal, and a second terminal coupled to said base of said first transistor;
   a second transistor having a collector coupled to said second terminal of said second resistor, a base coupled to said second terminal of said second resistor, and an emitter;
   a third resistor having a first terminal coupled to said emitter of said second transistor, and a second terminal coupled to said second terminal of said first resistor; and
   means coupled to said second power supply voltage terminal and to said second terminal of said second resistor, for selectively reducing a resistance between the first power supply voltage terminal and said second terminal of said resistor in response to a control signal.

9. The logic circuit of claim 8 wherein said switching means comprises a plurality of transistors each having a collector coupled to a third power supply voltage terminal, a base for receiving a respective one of said plurality of input signals, and an emitter coupled to said output terminal.

10. The logic circuit of claim 8 wherein said means comprises a third transistor having a first current electrode coupled to said second power supply voltage terminal, a control electrode for receiving said control signal, and a second current electrode coupled to said second terminal of said second resistor.

11. The logic circuit of claim 10 wherein said third transistor is a P-channel MOS transistor.

* * * * *